(12) United States Patent
Chen et al.

(10) Patent No.: US 10,134,791 B1
(45) Date of Patent: Nov. 20, 2018

(54) BACKSIDE ILLUMINATION GLOBAL SHUTTER SENSOR AND PIXEL THEREOF

(71) Applicant: Novatek Microelectronics Corp., Hsinchu (TW)

(72) Inventors: I-Hsiu Chen, Taipei (TW); Wei-Kuo Huang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/849,634

(22) Filed: Dec. 20, 2017

(51) Int. Cl.
| H01L 27/146 | (2006.01) |
| H01L 25/16 | (2006.01) |
| H01L 23/552 | (2006.01) |
| H01L 31/0232 | (2014.01) |

(52) U.S. Cl.
CPC .... *H01L 27/14623* (2013.01); *H01L 27/1463* (2013.01); *H01L 27/1464* (2013.01); *H01L 27/14621* (2013.01); *H01L 27/14627* (2013.01); *H01L 27/14629* (2013.01); *H01L 27/14636* (2013.01); *H01L 27/14645* (2013.01); *H01L 23/552* (2013.01); *H01L 25/167* (2013.01); *H01L 27/1461* (2013.01); *H01L 31/0232* (2013.01)

(58) Field of Classification Search
CPC . H01L 23/552; H01L 25/167; H01L 27/1461; H01L 27/1464; H01L 31/0232
USPC ........................................................ 257/435
See application file for complete search history.

(56) References Cited

U.S. PATENT DOCUMENTS

| 2001/0035542 A1* | 11/2001 | Fossum ............. H01L 27/14601 257/292 |
| 2014/0246568 A1* | 9/2014 | Wan ..................... H01L 27/1461 250/214.1 |
| 2016/0204150 A1* | 7/2016 | Oh ..................... H01L 27/14623 257/229 |
| 2016/0211306 A1 | 7/2016 | Choi et al. |
| 2016/0351606 A1* | 12/2016 | Azami ................ H01L 27/1461 |
| 2017/0047367 A1* | 2/2017 | Lee ...................... H01L 27/1463 |
| 2017/0117315 A1 | 4/2017 | Chen et al. |
| 2017/0125474 A1* | 5/2017 | Roy ..................... H01L 27/1461 |

(Continued)

OTHER PUBLICATIONS

Velichko et al., "Low Noise High Efficiency 3.75 μm and 2.8 μm Global Shutter CMOS Pixel Arrays," International Image Sensor Workshop, Jun. 2013, pp. 1-4.

*Primary Examiner* — George Fourson, III
(74) *Attorney, Agent, or Firm* — JCIPRNET (57) ABSTRACT

A backside illumination global shutter pixel is disposed in a substrate having a first surface and a second surface and includes an isolation structure having a deep trench isolation pattern, a storage node, and a photoelectric conversion element. The deep trench isolation pattern has a channel and defines a first region and a second region connected with each other by the channel. The storage node is disposed in the second region. The photoelectric conversion element has a main photoelectric conversion portion disposed in the first region and an extending photoelectric conversion portion extended from the main photoelectric conversion portion through the channel to the second region. The extending photoelectric conversion portion is disposed between the second surface and the storage node. A backside illumination global shutter sensor including a plurality of backside illumination global shutter pixels is also provided.

20 Claims, 9 Drawing Sheets

(56) References Cited

U.S. PATENT DOCUMENTS

2017/0134683 A1    5/2017  Guyader et al.
2017/0358617 A1*  12/2017  Tekleab .............. H01L 27/1461
2018/0190695 A1*   7/2018  Jang ................. H01L 27/14607

* cited by examiner

BACKSIDE ILLUMINATION GLOBAL SHUTTER SENSOR AND PIXEL THEREOF

BACKGROUND OF THE INVENTION

1. Field of the Invention

The disclosure relates to a sensor, in particular, to a backside illumination global shutter sensor.

2. Description of Related Art

An image sensor is a semiconductor device that converts an optical image into electrical signals. Currently, most of the global shutter complementary metal oxide semiconductor (CMOS) image sensors in the market are front side illumination (FSI) global shutter image sensors. However, when the mainstream of the pixel in the image sensor is becoming smaller and smaller, the bad influence of the metal traces of the FSI pixel on the incident light becomes more and more obvious. Especially, in the global shutter pixel, at least one storage node must be used for storing the photo electrons, and a metal must be disposed above the storage node for blocking the incident light. Therefore, there is less light passing through the openings in the global shutter pixel, so amount of the light entering the FSI global shutter pixel having small pitch is further reduced.

In order to solve the problem that amount of light entering the pixel is reduced, backside illumination pixel is developed. However, when the global shutter pixel is developed to be a backside illumination pixel, the shutter efficiency is still a problem to be solved. Generally, in the global shutter mode, the photo diodes of all of the pixels are exposed at the same time to produce photoelectrons. Simultaneously, the produced photoelectrons are transmitted to and stored in the storage nodes, and then read by a circuit in the following process. Therefore, the photoelectrons are remained in the storage node for a period of time, and any change of the photoelectrons is not wanted during this period of time. Nonetheless, if there is light leaking and entering the storage node thus additional photoelectrons are produced, the signals provided by the storage nodes will change after the exposure of the pixels is stopped, thereby reducing the efficiency of simultaneously stopping the exposure of the pixels.

Figure 9:
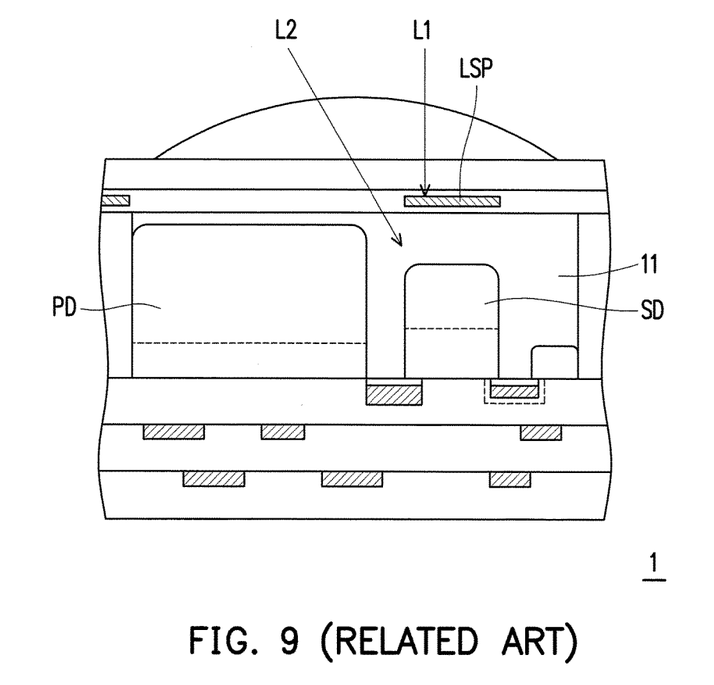
FIG. 9 is a cross-sectional view illustrating a backside illumination global shutter sensor in the related art.

FIG. 9 is a cross-sectional view illustrating a backside illumination global shutter sub-pixel in the related art. As shown in FIG. 9, a backside illumination global shutter sub-pixel 1 is disposed in a substrate 11 and includes a photoelectric conversion element PD and a storage diode SD, a light-shielding pattern LSP. The light-shielding pattern LSP is disposed above the storage diode SD to prevent the light from entering the storage diode SD. However, as depicted in FIG. 9, although a light L1 is blocked by the light-shielding pattern LSP, it is possible that another light L2 is transmitted to the storage diode SD.

SUMMARY OF THE INVENTION

Accordingly, the disclosure is directed to a backside illumination global shutter sensor having a plurality of backside illumination global shutter pixels capable of providing better shutter efficiency.

The disclose provides a backside illumination global shutter pixel disposed in a substrate having a first surface and a second surface, the backside illumination global shutter pixel includes an isolation structure, a storage node, and a photoelectric conversion element. The isolation structure has a deep trench isolation pattern, wherein the deep trench isolation pattern has a channel and defines a first region and a second region connected with each other by the channel. The storage node is disposed in the second region. The photoelectric conversion element has a main photoelectric conversion portion and an extending photoelectric conversion portion, wherein the main photoelectric conversion portion is disposed in the first region, the extending photoelectric conversion portion is extended from the main photoelectric conversion portion through the channel to the second region, and the extending photoelectric conversion portion is disposed between the second surface and the storage node.

The disclosure provides a backside illumination global shutter sensor including a substrate and a plurality of pixels. The substrate has a first surface and a second surface. The plurality of pixels are disposed in the substrate. Each pixel includes an isolation structure, a storage node, and a photoelectric conversion element. The isolation structure has a deep trench isolation pattern, wherein the deep trench isolation pattern has a channel and defines a first region and a second region connected with each other by the channel. The storage node is disposed in the second region. The photoelectric conversion element has a main photoelectric conversion portion and an extending photoelectric conversion portion, wherein the main photoelectric conversion portion is disposed in the first region, the extending photoelectric conversion portion is extended from the main photoelectric conversion portion through the channel to the second region, and the extending photoelectric conversion portion is disposed between the second surface and the storage node.

In one embodiment of the disclosure, the second surface receives light from an external light source, and the first region is an illuminated region.

In one embodiment of the disclosure, the backside illumination global shutter pixel further includes a microlens layer, wherein the light from the external light source is focused by the microlens layer to illuminate the first region.

In one embodiment of the disclosure, a part of the extending photoelectric conversion portion fills the channel, and another part of the extending photoelectric conversion portion is located between the storage node and the channel.

In one embodiment of the disclosure, the deep trench isolation pattern penetrates the substrate and connects the first surface with the second surface.

In one embodiment of the disclosure, the isolation structure further has a backside shielding structure comprising a metal grid layer and a metal plug layer, the metal grid layer is disposed on the second surface and corresponding to the second region, and the metal plug layer is disposed corresponding to the deep trench isolation pattern and between the metal grid layer and the second surface.

In one embodiment of the disclosure, the isolation structure further has a front side isolation structure including a reflector and a contact layer, the reflector is disposed on the first surface and corresponding to the first region, and the contact layer is disposed corresponding to the deep trench isolation pattern and between the reflector and the first surface.

In one embodiment of the disclosure, the isolation structure further has a front side isolation structure including a reflector, and the reflector is disposed on the first surface and corresponding to the second region.

In one embodiment of the disclosure, the isolation structure further has a front side isolation structure comprising at least two reflectors and a contact layer, the two reflectors are disposed on the first surface and respectively corresponding to the first region and the second region, and the contact layer is disposed corresponding to the deep trench isolation pattern and between the two reflectors and the first surface.

In one embodiment of the disclosure, the backside illumination global shutter pixel further includes a colour filter layer disposed on the second surface.

The abovementioned features and advantages of the invention will become more obvious and better understood with regard to the following description of the exemplary embodiments and accompanying drawings in the below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
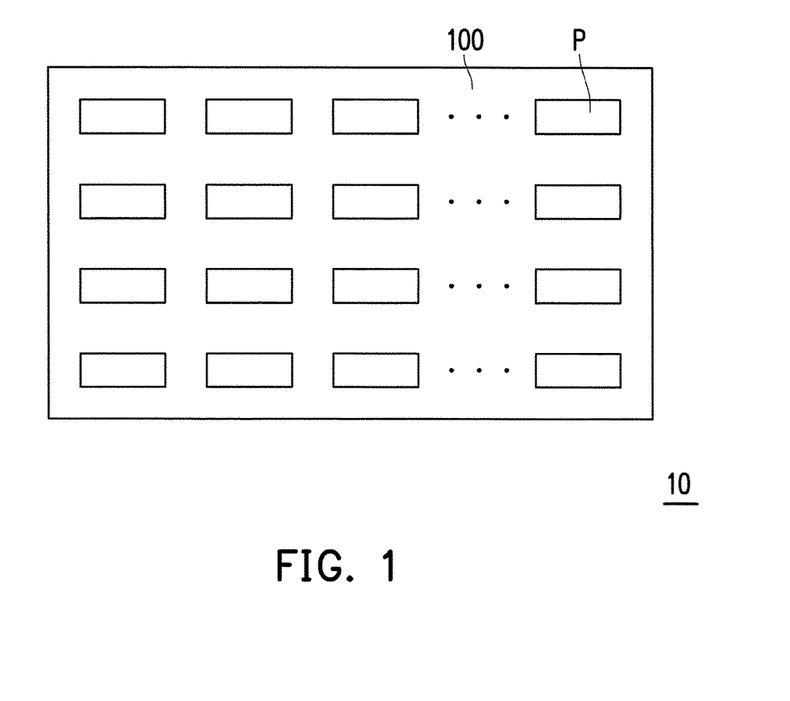
FIG. 1 is a top view illustrating a backside illumination global shutter sensor according to an embodiment of the disclosure.

FIG. 1 is a top view illustrating a backside illumination global shutter sensor according to an embodiment of the disclosure. Referring to the embodiment in FIG. 1, a backside illumination global shutter sensor 10 includes a substrate 100 and a plurality of pixels P disposed in the substrate 100.

Figure 2:
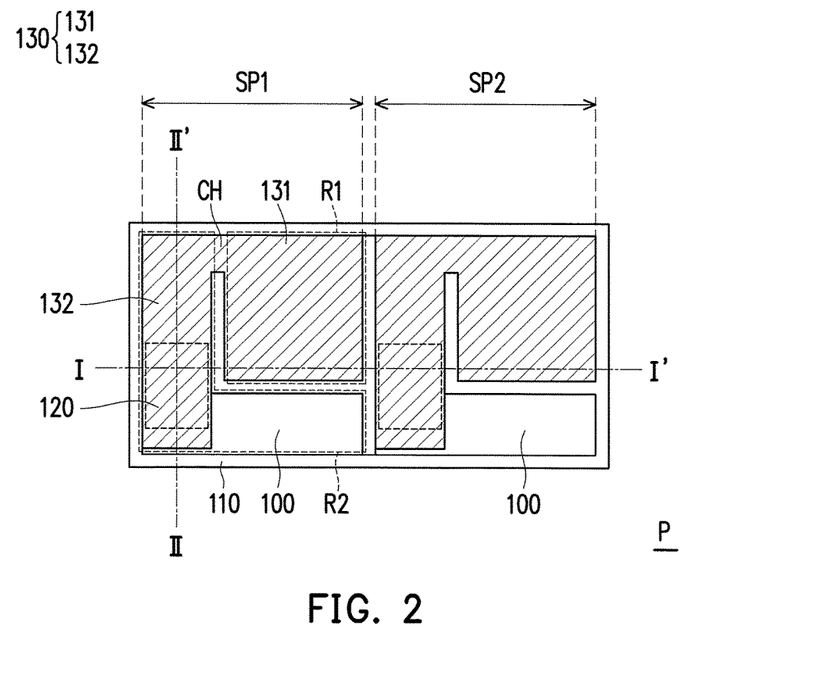
FIG. 2 is a top view illustrating a backside illumination global shutter pixel of the backside illumination global shutter sensor in FIG. 1.

FIG. 2 is a top view illustrating the backside illumination global shutter pixel P of the backside illumination global shutter sensor 10 in FIG. 1. In this embodiment, the backside illumination global shutter pixel P includes two pixels SP1 and SP2, but the disclosure is not limited thereto. For clarifying purpose, only a deep trench isolation pattern 110, a storage node 120, and a photoelectric conversion element 130 in each pixel are shown in FIG. 2, and other components are omitted and described afterwards. To be more specific, in the pixel SP1 of the present embodiment, the deep trench isolation pattern 110 has a channel CH, and the deep trench isolation pattern 110 defines a first region R1 and a second region R2 connected with each other by the channel CH. The storage node 120 is disposed in the second region R2. The photoelectric conversion element 130 includes a main photoelectric conversion portion 131 and an extending photoelectric conversion portion 132. In addition, the main photoelectric conversion portion 131 is disposed in the first region R1, the extending photoelectric conversion portion 132 is extended from the main photoelectric conversion portion 131 through the channel CH to the second region R2, and the extending photoelectric conversion portion 132 is disposed between the second surface 100b and the storage node 120. For example, the photoelectric conversion element 130 may include a photo diode, a photo transistor, a photo gate, a pinned photo diode (PPD), or any combination thereof, the invention is not limited thereto.

The deep trench isolation pattern 110 may include an insulating material provided in a trench or a via. In another embodiment, the deep trench isolation pattern 110 may include an insulating material of which a refractive index is lower than that of the substrate 100. In another embodiment, the deep trench isolation pattern 110 may be a dopant region that is formed by doping a portion of the substrate 100 with dopants. The disclosure is not limited thereto.

Figure 3:
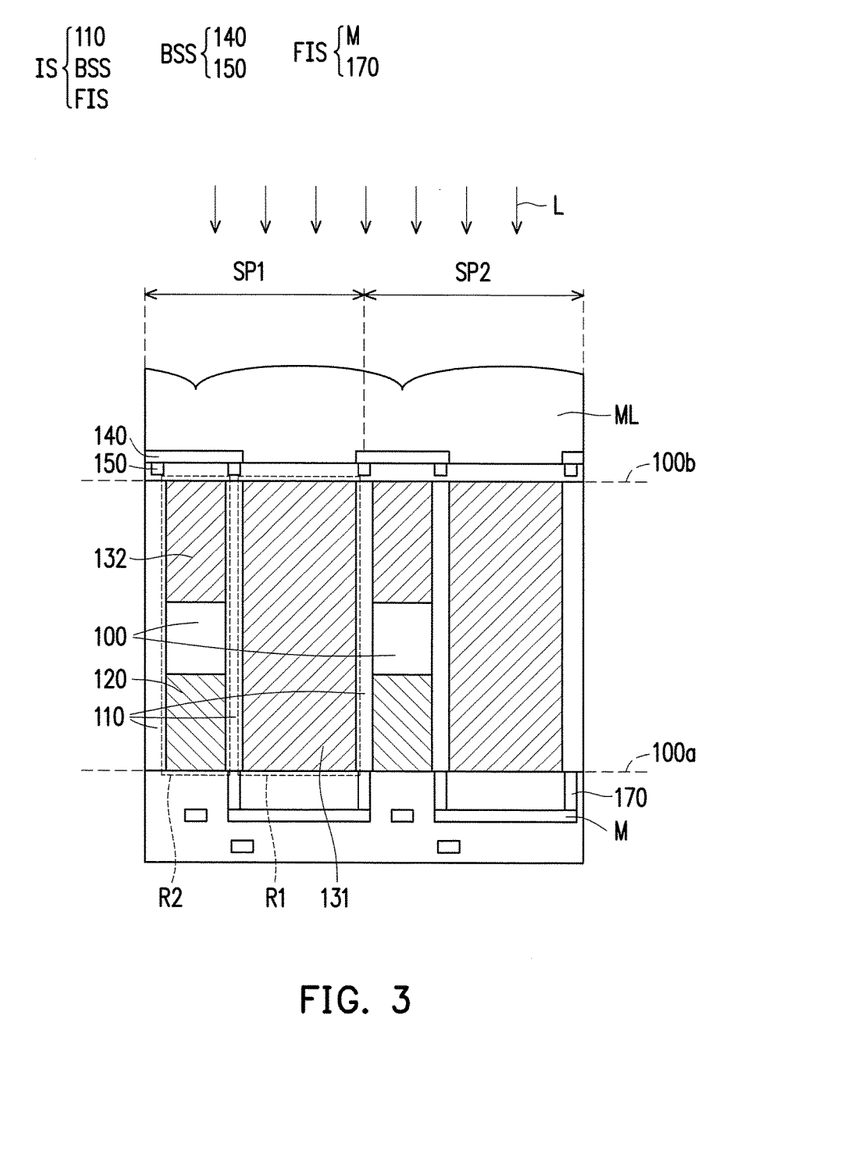
FIG. 3 is a cross-sectional view along a section line I-I' illustrating the backside illumination global shutter pixel in FIG. 2.

To better describe the present embodiment, please refer to FIG. 3. FIG. 3 is a cross-sectional view along a section line I-I' illustrating the backside illumination global shutter pixel P in FIG. 2. The substrate 100 includes a first surface 100a and a second surface 100b. The second surface 100b receives light L from an external light source, and the first region R1 is an illuminated region. For example, the backside illumination global shutter pixel P further includes a microlens layer ML disposed on the second surface 100b, the light L from the external light source is focused or converged by the microlens layer ML to illuminate the first region R1, but the disclosure is not limited thereto.

Referring to FIGS. 2 and 3 simultaneously, from the top view of in the lighting direction, the storage node 120 is completely hidden behind the extending photoelectric conversion portion 132 of the photoelectric conversion element 130. Additionally, a part of the substrate 100 is located between the extending photoelectric conversion portion 132 and the storage node 120. In other words, the extending photoelectric conversion portion 132 of the photoelectric conversion element 130 is extended from the illuminated region and located above the storage node 120. Therefore, after the light L passes through the microlens layer ML, any scattering or leaking portion of the light L transmitted toward the storage node 120 is absorbed by the extending photoelectric conversion portion 132 before approaching the storage node 120.

Figure 4:
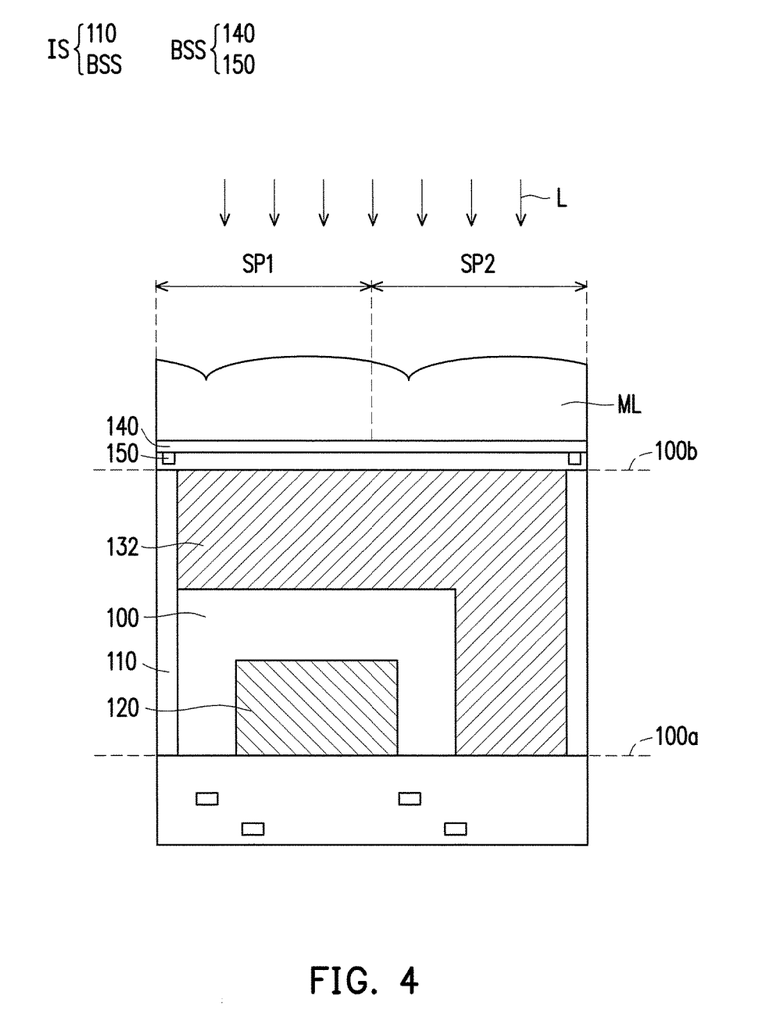
FIG. 4 is a cross-sectional view along a section line II-IF illustrating the backside illumination global shutter pixel in FIG. 2.

Further, FIG. 4 is a cross-sectional view along a section line II-IF illustrating the backside illumination global shutter pixel P in FIG. 2. Referring to FIGS. 2 and 4 simultaneously, a part of the extending photoelectric conversion portion 132 fills the channel CH, and another part of the extending photoelectric conversion portion 132 is located between the storage node 120 and the channel CH. Additionally, a part of the substrate 100, which has ∩-shaped, is located between the extending photoelectric conversion portion 132 and the storage node 120. That is to say, the storage node 120 is distant from the channel CH because of the extending photoelectric conversion portion 132 and the part of the substrate 100. Thus, any scattering or leaking portion of the light L at the channel CH is absorbed by the extending photoelectric conversion portion 132 before reaching/approaching the storage node 120.

In the present embodiment, the channel CH may have a rectangular shape, but the shape of the channel CH is not limited in the disclosure.

Referring to FIGS. 3 and 4, the deep trench isolation pattern 110 belongs to an isolation structure IS, and the isolation structure IS further includes a backside shielding structure BSS and a front side isolation structure FIS. The backside shielding structure BSS includes a metal grid layer 140 and a metal plug layer 150. The metal grid layer 140 is disposed on the second surface 100b and corresponding to the second region R2, and the metal plug layer 150 is disposed corresponding to the deep trench isolation pattern 110 and between the metal grid layer 140 and the second surface 100b. Hence, backside shielding structure BSS prevents the light from entering the region R2 from the backside.

Further, the front side isolation structure FIS includes a reflector M and a contact layer 170, the reflector M is disposed on the first surface 100a and corresponding to the first region R1, and the contact layer 170 is disposed corresponding to the deep trench isolation pattern 110 and between the reflector M and the first surface 100a. Therefore, the front side isolation structure FIS prevents the light from being transmitted out of first region R1 at the front side and thus indirectly prevents the light entering the second region R2 from the front side.

As a result, the backside shielding structure BSS, the front side isolation structure FIS, and the deep trench isolation pattern 110 of the isolation structure IS block the light, so as to prevent the light from being transmitted from the first region R1 to the second region R2. In addition, any scattering or leaking portion of the light (e.g., at the channel CH) is absorbed by the extending photoelectric conversion portion 132 before approaching the storage node 120. Consequently, the storage node 120 is not affected by light, and the photoelectrons stored in the storage node 120 is remained the same after the global shutter is performed. In other words, the pixels P of the backside illumination global shutter sensor 10 are designed with good shutter efficiency.

Figure 5:
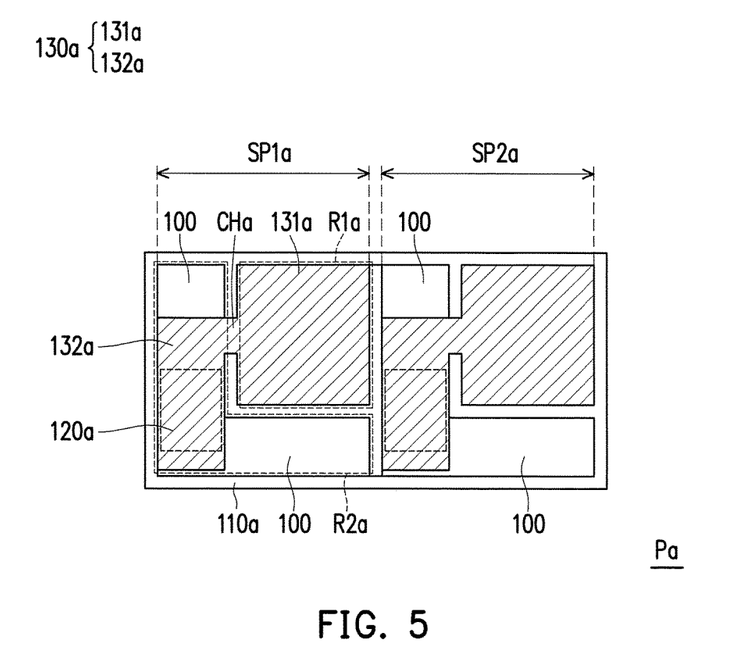
FIG. 5 is a top view illustrating a backside illumination global shutter pixel according to another embodiment of the disclosure.

FIG. 5 is a top view illustrating a backside illumination global shutter pixel according to another embodiment of the disclosure. In the present embodiment, backside illumination global shutter pixels Pa includes two pixels SP1a and SP2a, but the disclosure is not limited thereto. For clarifying purpose, only a deep trench isolation pattern 110a, a storage node 120a, and a photoelectric conversion element 130a in each pixel are shown in FIG. 5. In the pixel SP1a of the present embodiment, the deep trench isolation pattern 110a has a channel CHa, and the deep trench isolation pattern 110a defines a first region R1a and a second region R2a connected with each other by the channel CHa. The photoelectric conversion element 130a includes a main photoelectric conversion portion 131a and an extending photoelectric conversion portion 132a. The deep trench isolation pattern 110a, the storage node 120a, the main photoelectric conversion portion 131a and the extending photoelectric conversion portion 132a of the photoelectric conversion element 130a, the first region R1a, and the second region R2a of the present embodiment shown in FIG. 5 are disposed in a similar manner with the deep trench isolation pattern 110, the storage node 120, the main photoelectric conversion portion 131 and the extending photoelectric conversion portion 132 of the photoelectric conversion element 130, the first region R1, and the second region R2 of the embodiment shown in FIG. 2. Thus, details are not repeated hereinafter. The difference between the backside illumination global shutter pixel Pa shown in FIG. 5 and the backside illumination global shutter pixel P shown in FIG. 2 is that the channel CHa is not located near a corner of the deep trench isolation pattern 110a, but the channel CH is located at the middle of one wall of the deep trench isolation pattern 110a.

Figure 6:
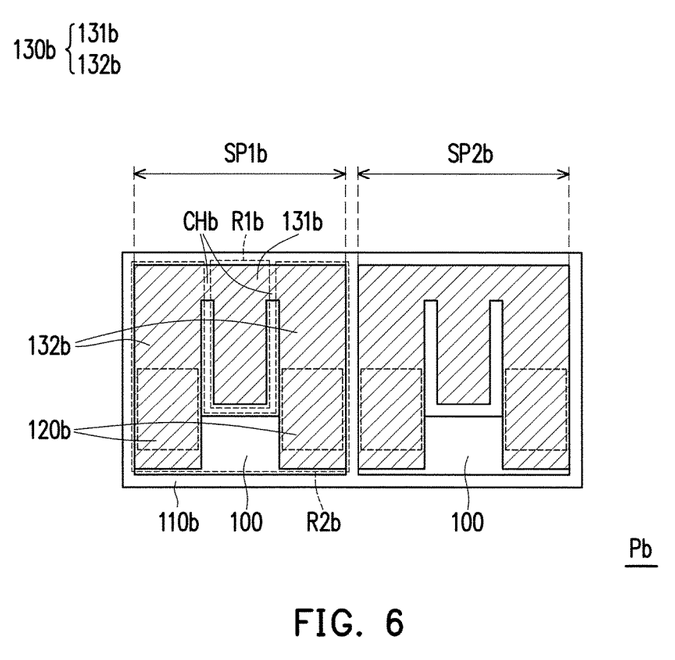
FIG. 6 is a top view illustrating a backside illumination global shutter pixel according to yet another embodiment of the disclosure.

FIG. 6 is a top view illustrating a backside illumination global shutter pixel according to yet another embodiment of the disclosure. In the present embodiment, backside illumination global shutter pixels Pb include two pixels SP1b and SP2b, but the disclosure is not limited thereto. For clarifying purpose, only a deep trench isolation pattern 110b, two storage nodes 120b, and a photoelectric conversion element 130b in each sup-pixel are shown in FIG. 6. In the pixel SP1b of the present embodiment, the deep trench isolation pattern 110b has two channels CHb, and the deep trench isolation pattern 110b defines a first region R1b and a second region R2b connected with each other by the two channels CHb. The two storage nodes 120b are disposed in the second region R2b. The photoelectric conversion element 130b includes a main photoelectric conversion portion 131b and two extending photoelectric conversion portions 132b. The two extending photoelectric conversion portions 132b are extended from the main photoelectric conversion portion 131b through the two channel CHb, respectively, to the second region R2b, and each of the two extending photoelectric conversion portions 132b is disposed between the second surface 100b and the corresponding storage node 120b. It should be noted here, the number of the storage nodes is two and the number of the extending photoelectric conversion portions is also two in the present embodiment, but the disclosure is not limited thereto. The number of the storage nodes or the extending photoelectric conversion portions may be greater than two in other embodiments. In the present embodiment, the two channels CHb are respectively located near two corners of the deep trench isolation pattern 110b, but the disclosure is not limited thereto. The channels may be not located near corners in other embodiments.

Figure 7:
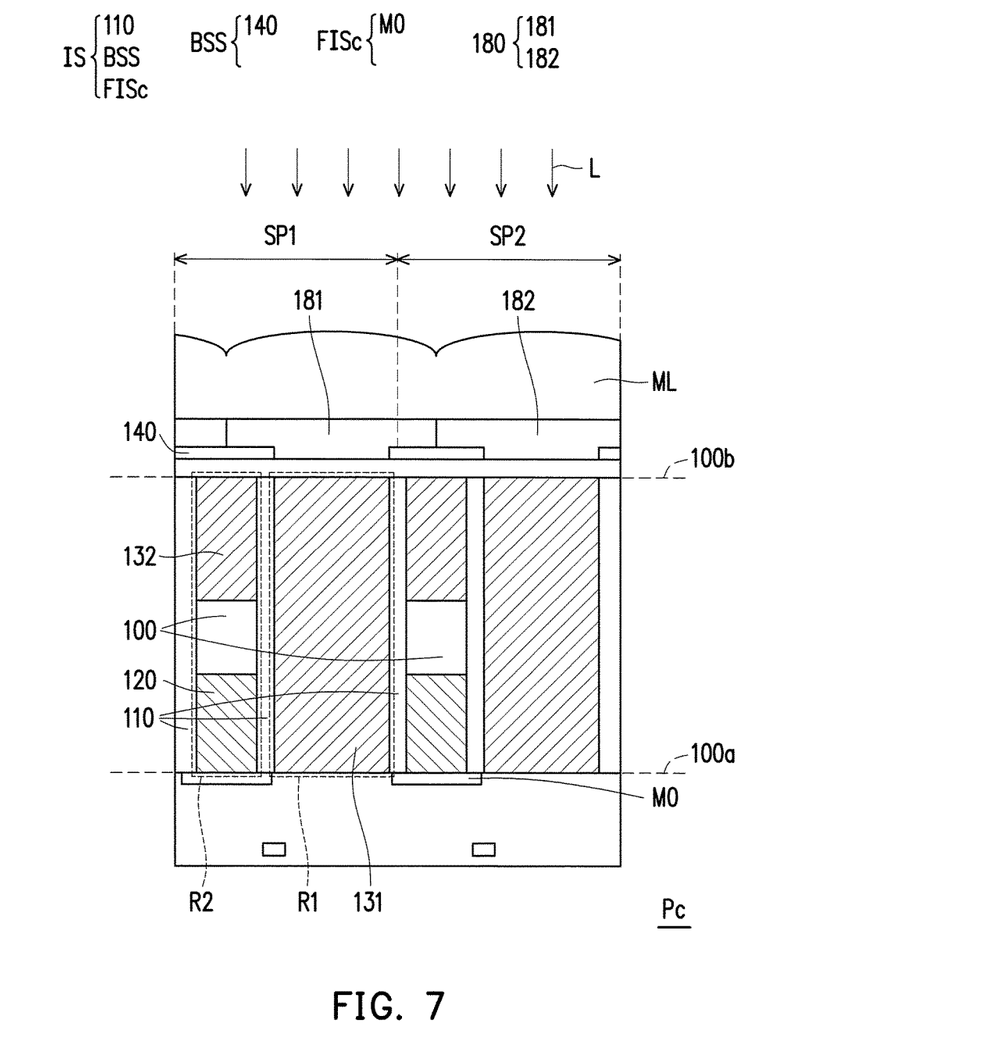
FIG. 7 is a cross-sectional view along a section line I-I' illustrating a backside illumination global shutter pixel according to yet another embodiment of the disclosure.

FIG. 7 is a cross-sectional view along a section line I-I' illustrating a backside illumination global shutter pixel according to yet another embodiment of the disclosure. The structure and the effects of a backside illumination global shutter pixel Pc shown in FIG. 7 are similar to the structure and the effects of the backside illumination global shutter pixel P shown in FIGS. 2 and 3, only the differences are described hereinafter. The backside illumination global shutter pixel Pc includes a colour filter 180 having a first colour sub-filter 181 and a second colour sub-filter 182. The colour filter 180 is configured to transmit specific wavelengths of light. For example, the first colour sub-filter 181 (e.g., a red color filter) may transmit light having wavelengths within a first range, while the second colour sub-filter 182 (e.g., a green color filter) may transmit light having wavelengths within a second range different than the first range. In the present embodiment, the number of the sub-filters is two, but the disclosure is not limited thereto. The number of the sub-filters may be greater than two in other embodiments. Further, the colour filter 180 is disposed between the microlens layer ML and the substrate 100, and the first colour sub-filter 181 and the second colour sub-filter 182 are respectively disposed corresponding to the sub-pixels SP1 and SP2. Moreover, a front side isolation structure FISc of the backside illumination global shutter pixel Pc includes a reflector M0 in each sub-pixel. The reflector M0 is disposed on the first surface 100a and corresponding to the second region R2. Therefore, the reflector M0 reflects the leaking light transmitted to the storage node 120 from the front side. In other words, the reflector M0 reflects the leaking light incident on the first surface 100a. Therefore, the reflector M0 blocks the leaking light thus the leaking light cannot approach the storage node 120 from the front side. The metal plug layer 150 may be omitted in embodiment of FIG. 7.

Figure 8:
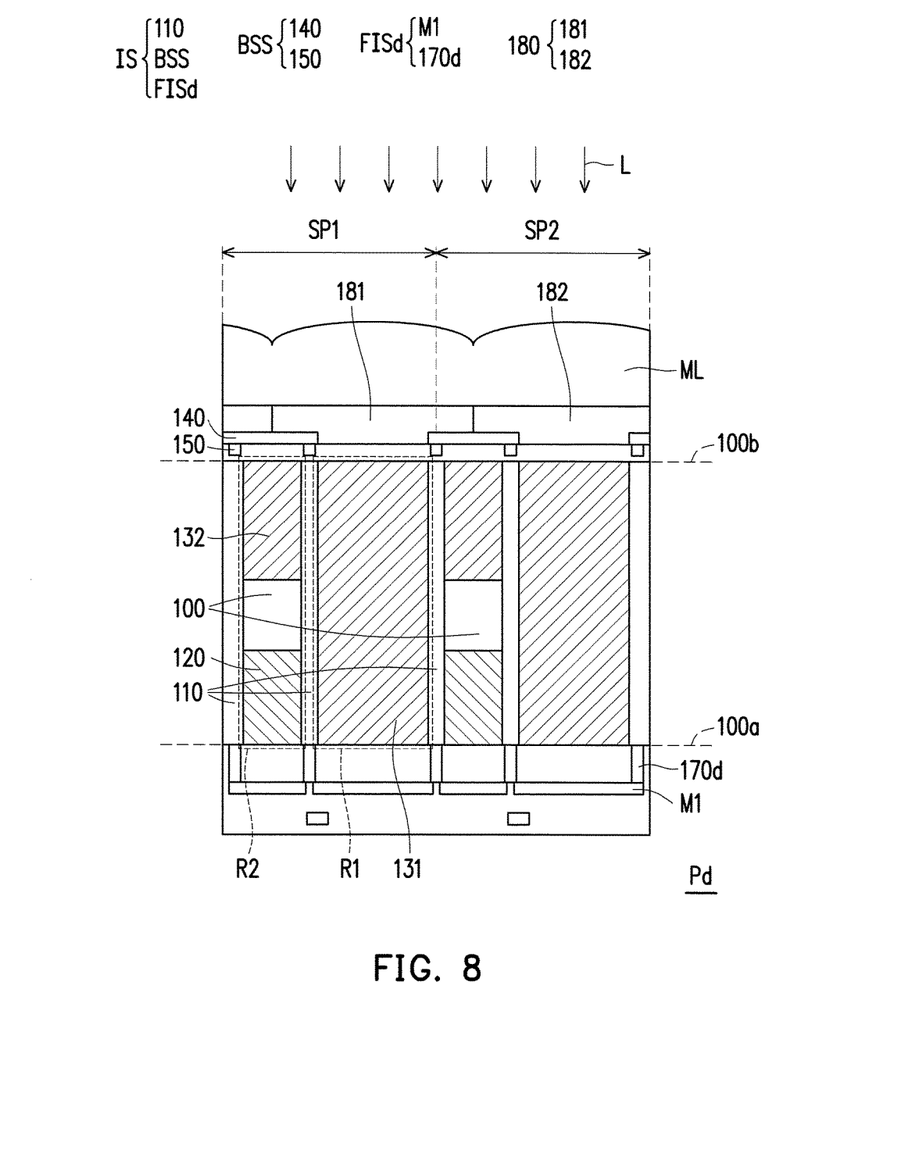
FIG. 8 is a cross-sectional view along a section line I-I' illustrating a backside illumination global shutter pixel according to yet another embodiment of the disclosure.

FIG. 8 is a cross-sectional view along a section line I-I' illustrating a backside illumination global shutter pixel according to yet another embodiment of the disclosure. The structure and the effects of a backside illumination global shutter pixel Pd shown in FIG. 8 are similar to the structure and the effects of the backside illumination global shutter pixel Pc shown in FIG. 7, only the differences are described hereinafter. In the present embodiment shown in FIG. 8, a front side isolation structure FISd of the backside illumination global shutter pixel Pd includes two reflectors M1 in a sub-pixel and further includes a contact layer 170d. In each sub-pixel, the two reflectors M1 are disposed on the first surface 100a and respectively corresponding to the first region R1 and the second region R2, and the contact layer 170d is disposed corresponding to the deep trench isolation pattern 110 and between the two reflectors M1 and the first surface 100a. That is to say, the front side isolation structure FISd prevents the light from leaking out of the first region R1 and also prevents the leaking light from entering the second region R2 and approaching the storage node 120 at the front side.

Summarily, not only is the storage node surrounded by the deep trench isolation pattern, the backside shielding structure, and the front side isolation structure, the storage node is also disposed below the extending photoelectric conversion portion. Especially, the extending photoelectric conversion portion is extended from the illuminated region through the channel to the above of the storage node, so the storage node is distant from the channel because of the extending photoelectric conversion portion. Therefore, any scattering or leaking portion of the light is blocked by the deep trench isolation pattern, the backside shielding structure, and the front side isolation structure and absorbed by the extending photoelectric conversion portion before approaching the storage node. Consequently, the storage node is not affected by light, and the photoelectrons stored in the storage node is remained the same after the global shutter is performed. In other words, the pixels of the backside illumination global shutter sensor of the disclosure are designed with good shutter efficiency.

In the disclosure, the backside illumination global shutter pixel structure is adjusted to improve the light leakage problem. In the current market, the 2.8 um global shutter pixel is the smallest pixel. However, in the disclosure, a 2.6 um global shutter pixel may be expectedly produced and has a better shutter efficiency in the visible range.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A backside illumination global shutter pixel, disposed in a substrate having a first surface and a second surface, the backside illumination global shutter pixel comprising:

an isolation structure, having a deep trench isolation pattern, wherein the deep trench isolation pattern has a channel and defines a first region and a second region connected with each other by the channel;
a storage node, disposed in the second region; and
a photoelectric conversion element, having a main photoelectric conversion portion and an extending photoelectric conversion portion, wherein the main photoelectric conversion portion is disposed in the first region, the extending photoelectric conversion portion is extended from the main photoelectric conversion portion through the channel to the second region, and the extending photoelectric conversion portion is disposed between the second surface and the storage node.

2. The backside illumination global shutter pixel as recited in the claim 1, wherein the second surface receives light from an external light source, and the first region is an illuminated region.

3. The backside illumination global shutter pixel as recited in the claim 2, further comprises a microlens layer disposed on the second surface, wherein the light from the external light source is focused by the microlens layer to illuminate the first region.

4. The backside illumination global shutter pixel as recited in the claim 1, wherein a part of the extending photoelectric conversion portion fills the channel, and another part of the extending photoelectric conversion portion is located between the storage node and the channel.

5. The backside illumination global shutter pixel as recited in the claim 1, wherein the deep trench isolation pattern penetrates the substrate and connects the first surface with the second surface.

6. The backside illumination global shutter pixel as recited in the claim 1, wherein the isolation structure further has a backside shielding structure comprising a metal grid layer, the metal grid layer is disposed on the second surface and corresponding to the second region.

7. The backside illumination global shutter pixel as recited in the claim 1, wherein the isolation structure further has a backside shielding structure comprising a metal plug layer, the metal plug layer is disposed corresponding to the deep trench isolation pattern.

8. The backside illumination global shutter pixel as recited in the claim 1, wherein the isolation structure further has a front side isolation structure comprising a reflector and a contact layer, the reflector is disposed on the first surface and corresponding to the first region, and the contact layer is disposed corresponding to the deep trench isolation pattern and between the reflector and the first surface.

9. The backside illumination global shutter pixel as recited in the claim 1, wherein the isolation structure further has a front side isolation structure comprising a reflector, and the reflector is disposed on the first surface and corresponding to the second region.

10. The backside illumination global shutter pixel as recited in the claim 1, wherein the isolation structure further has a front side isolation structure comprising at least two reflectors and a contact layer, the two reflectors are disposed on the first surface and respectively corresponding to the first region and the second region, and the contact layer is disposed corresponding to the deep trench isolation pattern and between the two reflectors and the first surface.

11. The backside illumination global shutter pixel as recited in the claim 1, further comprises a colour filter layer disposed on the second surface.

12. A backside illumination global shutter sensor, comprising:

a substrate, having a first surface and a second surface; and a plurality of pixels, disposed in the substrate, each of the pixels comprising:

an isolation structure, having a deep trench isolation pattern, wherein the deep trench isolation pattern has a channel and defines a first region and a second region connected with each other by the channel;

a storage node, disposed in the second region; and a photoelectric conversion element, having a main photoelectric conversion portion and an extending photoelectric conversion portion, wherein the main photoelectric conversion portion is disposed in the first region, the extending photoelectric conversion portion is extended from the main photoelectric conversion portion through the channel to the second region, and the extending photoelectric conversion portion is disposed between the second surface and the storage node.

13. The backside illumination global shutter sensor as recited in the claim 12, wherein the second surface receives light from an external light source, and the first region is an illuminated region.

14. The backside illumination global shutter sensor as recited in the claim 12, wherein a part of the extending photoelectric conversion portion fills the channel, and another part of the extending photoelectric conversion portion is located between the storage node and the channel.

15. The backside illumination global shutter sensor as recited in the claim 12, wherein the deep trench isolation pattern penetrates the substrate and connects the first surface with the second surface.

16. The backside illumination global shutter sensor as recited in the claim 12, wherein the isolation structure further has a backside shielding structure comprising a metal grid layer, and the metal grid layer is disposed on the second surface and corresponding to the second region.

17. The backside illumination global shutter sensor as recited in the claim 12, wherein the isolation structure further has a backside shielding structure comprising a metal plug layer, and the metal plug layer is disposed corresponding to the deep trench isolation pattern.

18. The backside illumination global shutter sensor as recited in the claim 12, wherein the isolation structure further has a front side isolation structure comprising a reflector and a contact layer, the reflector is disposed on the first surface and corresponding to the first region, and the contact layer is disposed corresponding to the deep trench isolation pattern and between the reflector and the first surface.

19. The backside illumination global shutter sensor as recited in the claim 12, wherein the isolation structure further has a front side isolation structure comprising a reflector, and the reflector is disposed on the first surface and corresponding to the second region.

20. The backside illumination global shutter sensor as recited in the claim 12, wherein the isolation structure further has a front side isolation structure comprising at least two reflectors and a contact layer, the two reflectors are disposed on the first surface and respectively corresponding to the first region and the second region, and the contact layer is disposed corresponding to the deep trench isolation pattern and between the two reflectors and the first surface.

* * * * *